United States Patent
Lu et al.

(10) Patent No.: US 10,325,772 B2
(45) Date of Patent: Jun. 18, 2019

(54) APPARATUS AND METHOD FOR WAFER CLEANING

(71) Applicant: Taiwan Semiconductor Manufacturing Co., Ltd., Hsin-Chu (TW)

(72) Inventors: Hsin-Hsien Lu, Hsinchu (TW); Ting-Kui Chang, New Taipei (TW); Jung-Tsan Tsai, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 150 days.

(21) Appl. No.: 15/416,331

(22) Filed: Jan. 26, 2017

(65) Prior Publication Data

US 2017/0133218 A1 May 11, 2017

Related U.S. Application Data

(62) Division of application No. 13/752,415, filed on Jan. 29, 2013, now Pat. No. 9,576,789.

(51) Int. Cl.
*H01L 21/02* (2006.01)
*H01L 21/67* (2006.01)
*H01L 21/306* (2006.01)

(52) U.S. Cl.
CPC ............ *H01L 21/02087* (2013.01); *H01L 21/02057* (2013.01); *H01L 21/30625* (2013.01); *H01L 21/67046* (2013.01); *H01L 21/67051* (2013.01); *H01L 21/67219* (2013.01)

(58) Field of Classification Search
None
See application file for complete search history.

(56) References Cited

U.S. PATENT DOCUMENTS

| 5,679,169 A | 10/1997 | Gonzales et al. |
| 5,894,852 A | 4/1999 | Gonzales et al. |
| 5,996,594 A | 12/1999 | Roy et al. |
| 6,273,101 B1 | 8/2001 | Gonzales et al. |

(Continued)

FOREIGN PATENT DOCUMENTS

| KR | 10-2005-0074556 | 7/2005 |
| KR | 10-2009-0034538 | 4/2009 |

(Continued)

OTHER PUBLICATIONS

KR 20050074556 EPO machine translation, retrieved from https://worldwide.espacenet.com/publicationDetails/biblio?II=0&ND=3&adjacent=true&locale=en_EP&FT=D&date=20050718&CC=KR&NR=20050074556A&KC=A (Year: 2005).*

(Continued)

*Primary Examiner* — Eric W Golightly
(74) *Attorney, Agent, or Firm* — Duane Morris LLP

(57) ABSTRACT

A wafer cleaning apparatus includes a polishing unit used in chemical mechanical polishing (CMP) of a wafer and a cleaning dispensing unit arranged to direct cleaning fluids toward a far edge of the wafer after the CMP of the wafer. A wafer cleaning method includes CMP of a wafer by a polishing unit and directing cleaning fluids toward a far edge of the wafer after the CMP of the wafer by a cleaning dispensing unit. Another method can include CMP, applying deionized water, and applying pH adjuster having a pH range from about 2 to about 13.

15 Claims, 5 Drawing Sheets

(56) References Cited

U.S. PATENT DOCUMENTS

| | | |
|---|---|---|
| 6,467,120 B1 | 10/2002 | Ziemins et al. |
| 6,640,816 B2 | 11/2003 | Gonzales et al. |
| 6,852,682 B2 | 2/2005 | Small et al. |
| 7,033,978 B2 | 4/2006 | Andreas |
| 7,045,017 B2 | 5/2006 | Gonzales et al. |
| 7,510,972 B2 | 3/2009 | Nishimura et al. |
| 2006/0154838 A1 | 7/2006 | Hayashida et al. |
| 2009/0133716 A1 | 5/2009 | Lee |

FOREIGN PATENT DOCUMENTS

| | | |
|---|---|---|
| KR | 10-2009-0117231 | 11/2009 |
| KR | 10-2010-0077947 | 7/2010 |

OTHER PUBLICATIONS

Singh, R.K. et al., "Post-CMP Clean PVA Brush Advancements and Characterization in CU/Low-K Applications", Application Note, ENTEGRIS, Inc., 2007, 6 pages.

Official Action dated Jan. 24, 2014 in counterpart Korean Patent Application No. 10-2013-0036120.

Notice of Allowance dated Jun. 24, 2014 in counterpart Korean Patent Application No. 10-2013-0036120.

EPO machine translation of KR 20090034538 to Choi, retrieved on Feb. 8, 2016.

\* cited by examiner

APPARATUS AND METHOD FOR WAFER CLEANING

PRIORITY CLAIM AND CROSS-REFERENCE

This application is a division of U.S. patent application Ser. No. 13/752,415, filed Jan. 29, 2013 and issued as U.S. Pat. No. 9,576,789 on Feb. 21, 2017, which is incorporated by reference herein in its entirety.

TECHNICAL FIELD

The disclosure is related to a method, apparatus and composition used in cleaning far edges of wafers used in semiconductor devices.

BACKGROUND

Chemical mechanical polishing, CMP, is commonly used in the semiconductor manufacturing industry to polish and remove metal or other materials from over a surface of a semiconductor substrate upon which semiconductor devices are being fabricated. Most commonly, conductive interconnect patterns are formed on semiconductor devices by forming a series of openings, such as vias and trenches in an insulating material disposed on a substrate surface, and then forming a conductive layer over the substrate surface and filling the openings. Damascene technology involves removing the conductive material from over the surface such that the conductive material remains only in the openings to form conductive structures such as various plugs and leads that serve as interconnection patterns and vias. CMP is also used extensively for planarizing shallow trench isolation regions.

When polishing to remove metal materials from over the substrate surface, it is critical to ensure that no metal residue remains over the surface as this can cause bridging between otherwise isolated conductive features, resulting in short circuits. Even when additional steps such as brush cleaning are used after CMP, residues remain that can still cause defects.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features can be arbitrarily expanded or reduced for clarity. Like numerals denote like features throughout the specification and drawing.

DETAILED DESCRIPTION

The disclosure provides a wafer cleaning apparatus including a polishing unit used in CMP of a wafer and a cleaning dispensing unit arranged to direct cleaning fluids toward a far edge of the wafer after the CMP of the wafer.

The disclosure also provides a method for wafer cleaning including CMP of a wafer by a polishing unit and directing cleaning fluids toward a far edge of the wafer after the CMP of the wafer by a cleaning dispensing unit.

The disclosure further provides a method of applying a chemical composition toward a far edge of a wafer, the method including CMP of the wafer, applying deionized water to the wafer, and applying a cleaning chemical containing pH adjuster, such as one or more of $HNO_3$, $H_2SO_4$, $NH_4OH$, KOH or organic amine, the cleaning chemical used after CMP of the wafer and being an acid or an alkaline having a pH range from about 2 to about 13.

It should be understood that the proceeding examples are intended to be exemplary only and other cleaning apparatus, methods, and chemical compositions can be used in other exemplary embodiments and further components can also be included in the various embodiments.

Figure 1:
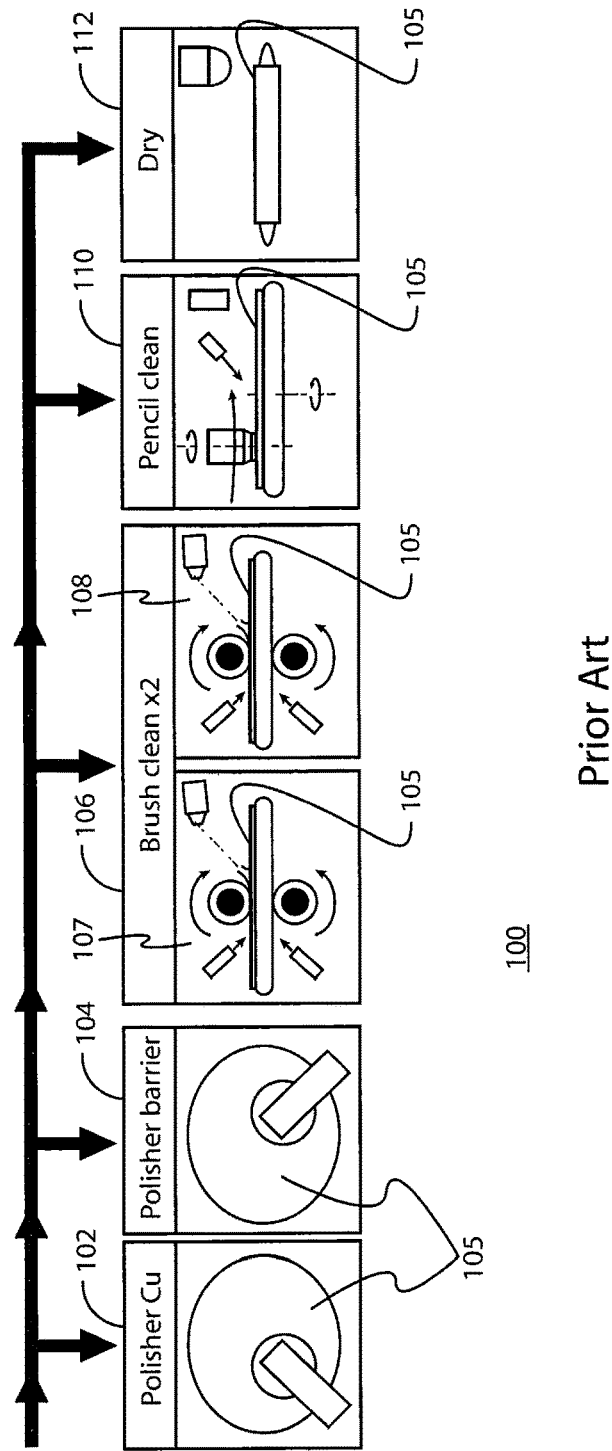
FIG. 1 is a system depicting an existing wafer cleaning system according to an embodiment.

FIG. 1 is a system 100 depicting an existing wafer cleaning system that includes two separate enclosures for CMP of a wafer 105. Chemical Mechanical Polishing/Planarization (CMP) is a process of smoothing surfaces with the combination of chemical and mechanical forces. A first enclosure 102 can use an abrasive and corrosive chemical slurry (commonly a colloid) in conjunction with a polishing pad and retaining ring to remove material such as copper from the surface of the wafer. A second enclosure 104 can similarly use a chemical slurry to further polish and remove barriers and oxide insulator (oxide and low dielectric constant material) on the wafer 105 as is known in the art. The post-CMP processes can include a brush cleaning process 106 which can be performed twice in a first brush cleaning process 107 and a second brush cleaning process 108. The processes 107 and 108 can be identical. The brush cleaning process can be followed by a pencil cleaning process 110 and a drying process 112 as illustrated.

Typical CMP tools comprise a rotating and extremely flat platen which is covered by a pad. The wafer that is being polished is mounted upside-down in a carrier/spindle on a backing film. A retaining ring keeps the wafer in the correct horizontal position. During the process of loading and unloading the wafer onto the tool, the wafer can be held by vacuum by the carrier to prevent unwanted particles from building up on the wafer surface. A slurry introduction mechanism deposits the slurry on the pad. Both the platen and the carrier can then be rotated and the carrier is kept oscillating as well. A downward pressure or down force is applied to the carrier, pushing it against the pad. In CMP, the mechanical properties of the wafer itself are considered too. If the wafer has a slightly bowed structure, the pressure will be greater on the edges than it would on the center, which causes non-uniform polishing. In order to compensate for the wafer bow, pressure can be applied to the wafer's backside which, in turn, will equalize the centre-edge differences. The pads used in the CMP tool should be rigid in order to uniformly polish the wafer surface. However, these rigid pads are kept in alignment with the wafer at all times. Therefore, real pads are often just stacks of soft and hard materials that conform to wafer topography to some extent. Generally, these pads are made from porous polymeric materials with a pore size between about 30 and about 50 µm, are consumed in the process, and are regularly reconditioned. The use of copper conductors on wafers since about 1990 led to the development of an additive patterning (damascene) process, which relies on the abilities of CMP to remove material in a planar and uniform fashion and to stop repeatably at the interface between copper and oxide insulating layers. Adoption of this process has made CMP processing much more widespread, but the CMP process remains a "dirty" process.

Figure 2:
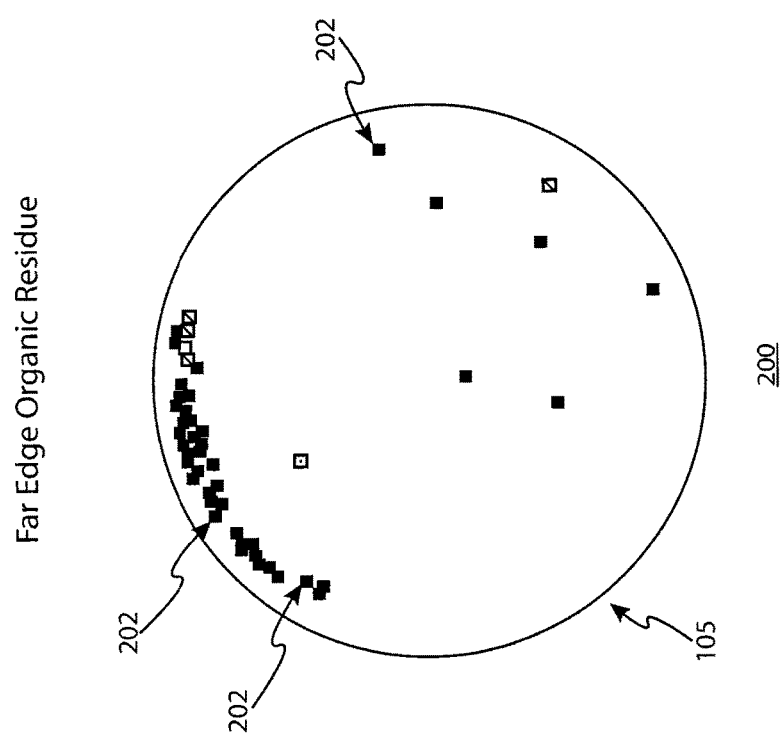
FIG. 2 is a top view showing a number of defects in a wafer after using the cleaning system of FIG. 1 according to an embodiment.

FIG. 2 depicts a polished and cleaned wafer 200 with defects 202 that has gone through the processes illustrated in FIG. 1. Even after polishing, brush cleaning, pencil cleaning and drying, the underlying wafer 150 will still have far edge organic residue forming the defects 202.

Figure 3:
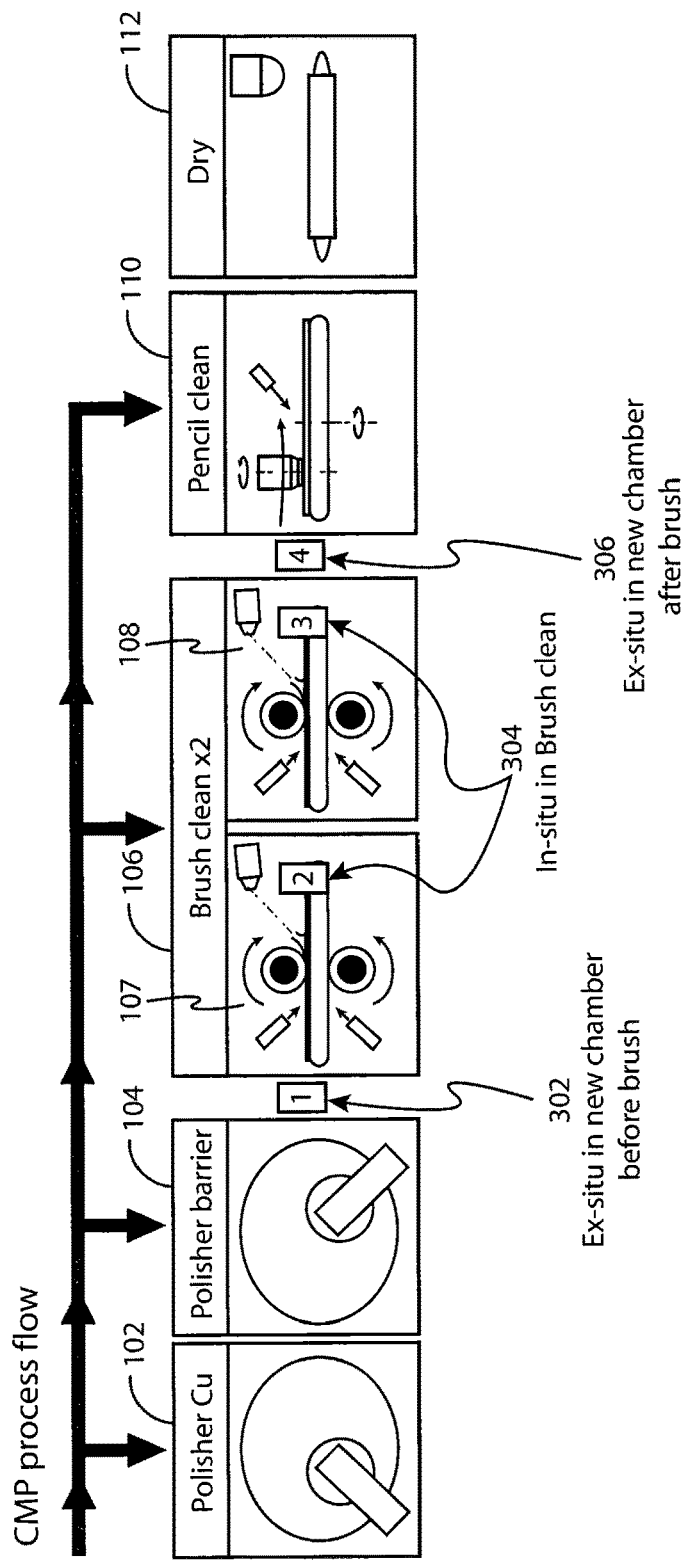
FIG. 3 is a system and flow diagram depicting a wafer cleaning system that further cleans a far edge of a wafer in accordance with the embodiments herein.

FIG. 3 depicts a wafer cleaning apparatus 300 similar in some respects to the wafer cleaning apparatus 100 of FIG. 1 since it includes at least a CMP portion (102 and 104). But the wafer cleaning apparatus 300 further includes a cleaning dispensing unit (302 or 304 or 306) arranged to direct cleaning fluids toward a far edge of the wafer after the CMP of the wafer. The wafer cleaning apparatus 300 can also include post CMP processes such as the brush cleaning process 106 which can be performed twice in a first brush cleaning process 107 and a second brush cleaning process 108 followed by a pencil cleaning process 110 and a drying process 112 as illustrated.

The cleaning dispensing unit or units 302, 304, and 306 can be arranged and placed in a number or locations within the overall wafer cleaning apparatus 300 in various embodiments. The cleaning dispensing unit or units can be arranged outside of the enclosure or enclosures for the polishing unit or units or the CMP processes (102 and 104). In one embodiment, the cleaning dispensing unit 302 can be arranged ex-situ of the polishing units in a new chamber or enclosure before the brush cleaning process 106. In another embodiment, a cleaning dispensing unit 304 can reside within (in-situ) an enclosure 107 or 108 for brush cleaning after the CMP. In yet another embodiment, a cleaning dispensing unit 306 can be arranged outside (ex-situ) after the enclosure(s) (102 and 104) for CMP and outside (ex-situ) and after the enclosure(s) (107 and 108) for brush cleaning. Again, the cleaning dispensing unit 306 can be in a new chamber after brush cleaning.

Of course, other arrangements or permutations or combinations can be made in accordance with the embodiments where one or more of the cleaning dispensing units (302, 304, or 306) are placed within the overall wafer cleaning apparatus 300. In one embodiment, the wafer cleaning apparatus 300 could include a first cleaning dispensing unit (304) within brush clean enclosure 107 or 108 and a second cleaning dispensing unit arranged outside and after an enclosure for CMP (302) or outside and after the enclosure for brush cleaning (306). In yet another embodiment, the wafer cleaning apparatus 300 could include at least a first cleaning dispensing unit (304) within the brush cleaning process (106), a second cleaning dispensing unit (302) arranged outside the enclosure(s) (102 and 104) for the polishing unit and a third cleaning dispensing unit (306) arranged outside the enclosure(s) (107 and 108) for brush cleaning. Further note that all the embodiments can further include not only one cleaning dispensing unit within the brush cleaning process 106, but can include one or more cleaning dispensing units for each enclosure (107 and 108) of the brush cleaning process 106. The embodiment illustrated in FIG. 3 can include a first cleaning dispensing unit (302) after CMP, a second cleaning dispensing unit (304) within the enclosure (107) for brush cleaning, a third cleaning dispensing unit with the enclosure (108) for brush cleaning, and a fourth cleaning dispensing unit (306) after brush cleaning (106).

Figure 4:
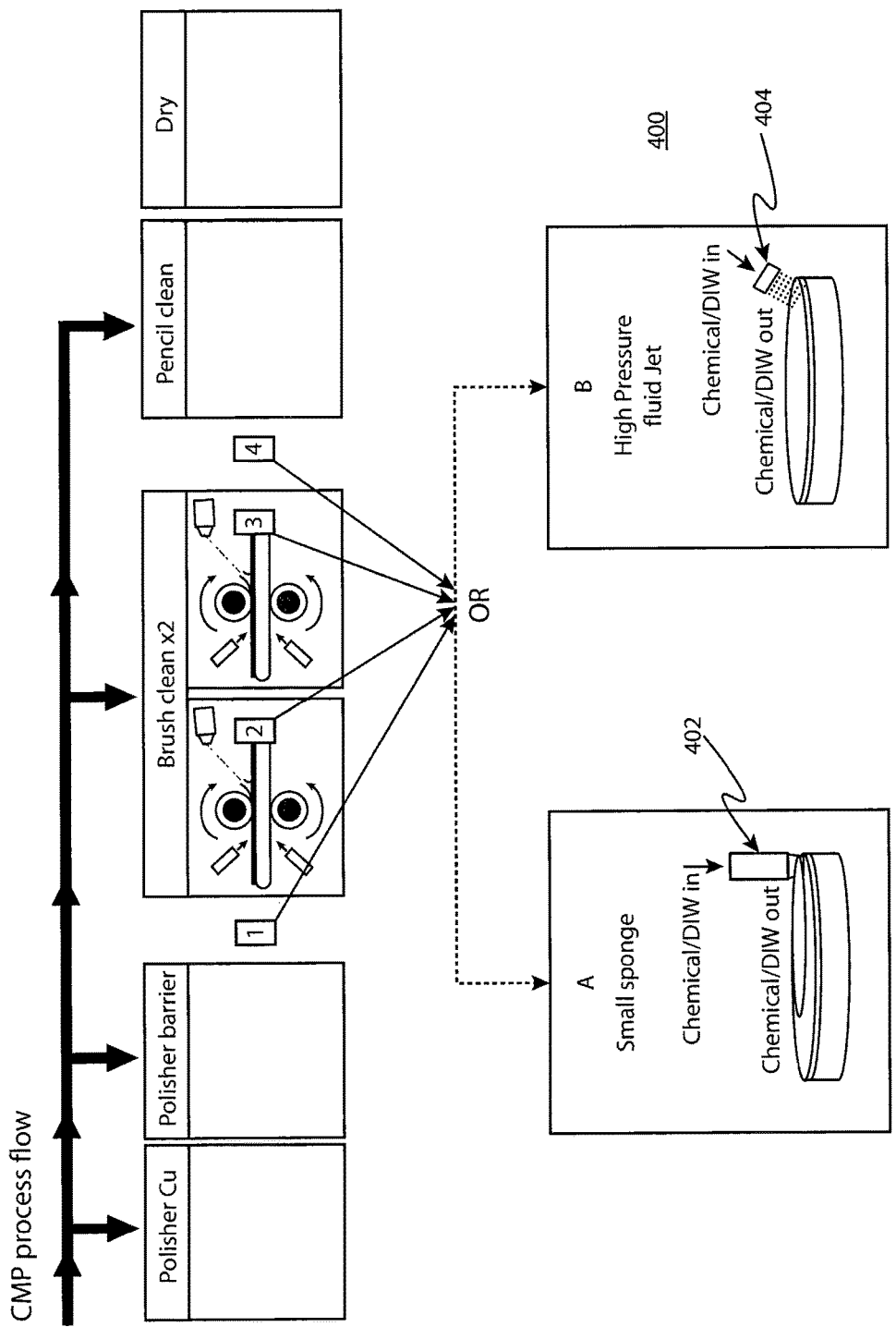
FIG. 4 is a further detailed view of the system and flow diagram of FIG. 3 according to an embodiment.

The cleaning dispensing units can be made of various materials and are not limited to the materials disclosed herein. For example, the cleaning dispensing units (302, 304 or 306) can be made of a sponge material comprising of Polyvinyl Alcohol (PVA), Polyvinyl Chloride (PVC), Polyurethene (PU), or Polyethylene Terephthalate (PET). The sponge material can have a porosity of about 30% to about 90%. In other embodiments, the sponge material can have a pore size of about 20 to about 200 micrometers. The cleaning dispensing units can also come in a form of a sponge having an concentric tube with inner chemical flow-in. In yet another embodiment, the cleaning dispensing unit can comprise a high pressure fluid jet. As illustrated in the wafer cleaning apparatus 400 of FIG. 4, each of the cleaning dispensing units can come in the form of a sponge 402 or a high pressure fluid jet 404. The wafer cleaning apparatus 400 is essentially the same as the wafer cleaning apparatus 300 of FIG. 3, except that each of the cleaning dispensing units can optionally be either a sponge (402) or a high pressure fluid jet (404). In one embodiment, the wafer cleaning apparatus 400 can just include sponges and in another embodiment the wafer cleaning apparatus 400 can just include high pressure fluid jets. In yet other embodiments, a combination of sponges and jets could be used.

In one example, the high pressure fluid jet (or the sponge) can use a cleaning chemical having a pH range from about 2 to about 13. The surface tension of the cleaning chemical can have a range of about 20 to about 70 dyne/cm, and a conductivity of the cleaning chemical can have a range of about 100 to about 4000 us/cm.

The chemical composition applied toward the far edge of the wafer (150) after CMP of the wafer can include deionized water and a cleaning chemical containing pH adjuster such as one or more of $HNO_3$, $H_2SO_4$, $NH_4OH$, KOH or organic amine, the cleaning chemical used after CMP of the wafer and being an acid or an alkaline having a pH range from about 2 to about 13. In one embodiment, the cleaning chemical can contain a pH adjuster such as a combination of two among $HNO_3$, $H_2SO_4$, $NH_4OH$, KOH and organic amine. As mentioned above, the surface tension of the cleaning chemical can have a range of about 20 to about 70 dyne/cm and the conductivity of the cleaning chemical can have a range of about 100 to about 4000 us/cm.

Figure 5:
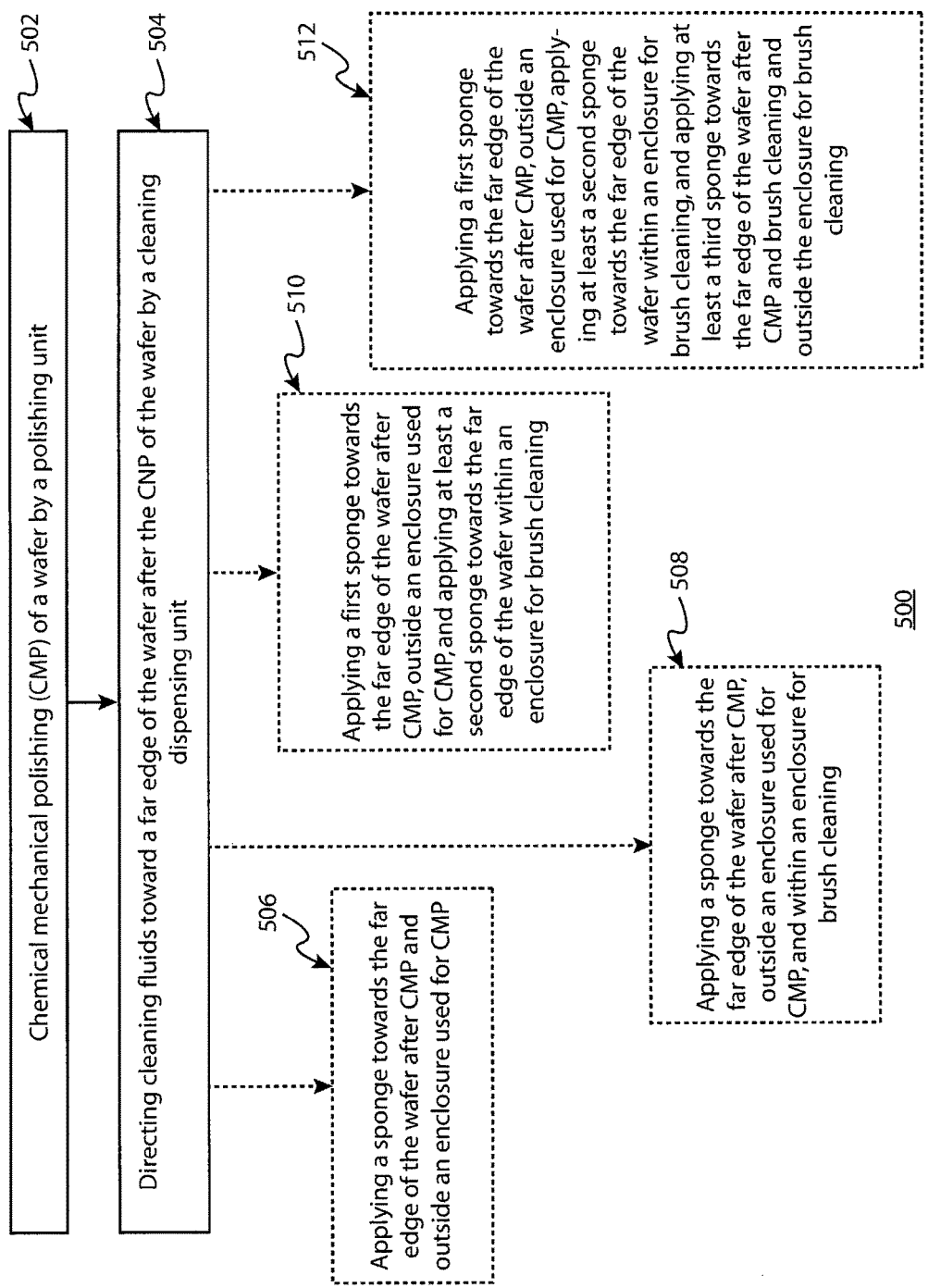
FIG. 5 is a flow chart depicting a method in accordance with the embodiments herein.

Referring to FIG. 5, a flow chart illustrates a wafer cleaning method 500. The method can include CMP of a wafer by a polishing unit at 502 and directing cleaning fluids toward a far edge of the wafer after the CMP of the wafer by a cleaning dispensing unit at 504. Directing cleaning fluids towards the far edge can be done in a number of ways. In one embodiment at 506, directing cleaning fluid can be done by applying a sponge towards the far edge of the wafer after CMP and outside an enclosure used for CMP. In another embodiment at 508, directing cleaning fluids towards the far edge of the wafer can be done by applying a sponge towards the far edge of the wafer after CMP, outside an enclosure used for CMP, and within an enclosure for brush cleaning. In another embodiment at 510, directing cleaning fluids towards the far edge of the wafer can be done by applying a first sponge towards the far edge of the wafer after CMP, outside an enclosure used for CMP, and applying at least a second sponge towards the far edge of the wafer within an enclosure for brush cleaning. In yet another embodiment at 512, directing cleaning fluids towards the far edge of the wafer can be done by applying a first sponge towards the far edge of the wafer after CMP, outside an enclosure used for CMP, applying at least a second sponge towards the far edge of the wafer within an enclosure for brush cleaning, and applying at least a third sponge towards the far edge of the wafer after CMP and brush cleaning and outside the enclosure for brush cleaning.

In some embodiments, a wafer cleaning apparatus comprises a polishing unit used in CMP of a wafer. A cleaning dispensing unit is arranged to direct cleaning fluids toward a far edge of the wafer after the CMP of the wafer.

In some embodiments, a wafer cleaning method, comprises CMP of a wafer by a polishing unit; and directing cleaning fluids toward a far edge of the wafer after the CMP of the wafer by a cleaning dispensing unit.

In some embodiments, a method of applying a chemical composition toward a far edge of a wafer comprises CMP of the wafer, applying deionized water to the wafer, and applying a cleaning chemical comprising at least one of $HNO_3$, $H_2SO_4$, $NH_4OH$, KOH or organic amine. The cleaning chemical is used after the CMP of the wafer and being an acid or an alkaline having a pH range from about 2 to about 13.

The preceding merely illustrates the principles of the disclosure. It will thus be appreciated that those skilled in the art will be able to devise various arrangements which, although not explicitly described or shown herein, embody the principles of the disclosure and are included within its spirit and scope. For example the disclosed cleaning dispensing unit can use other materials other than the disclosed sponges and fluid jets.

Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "before", "after", "top" and "bottom" as well as derivatives thereof (e.g., "horizontally," "downwardly," "upwardly," etc.) should be construed to refer to the orientation as then described or as shown in the drawing under discussion. The drawings are arbitrarily oriented for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments, which can be made by those skilled in the art without departing from the scope and range of equivalents.

What is claimed is:

1. A method of applying a chemical composition toward a far edge of a wafer, the method comprising:
    chemical mechanical polishing (CMP) of the wafer;
    applying deionized water to the wafer; and
    applying a cleaning chemical to the wafer, the cleaning chemical comprising at least one pH adjuster among $HNO_3$, $H_2SO_4$, $NH_4OH$, KOH or organic amine, the cleaning chemical being an acid or an alkaline having a pH range from about 2 to about 13, wherein applying the cleaning chemical includes directing the cleaning chemical towards a far edge of the wafer and applying a sponge towards the far edge of the wafer after CMP and outside an enclosure used for CMP.

2. The method of claim 1, wherein the cleaning chemical contains a combination of at least two of $HNO_3$, $H_2SO_4$, $NH_4OH$, KOH and organic amine.

3. The wafer cleaning method of claim 1, wherein applying the sponge towards the far edge of the wafer after CMP is performed within an enclosure for brush cleaning.

4. The wafer cleaning method of claim 1, wherein applying the cleaning chemical further includes applying at least a second sponge towards the far edge of the wafer within an enclosure for brush cleaning.

5. The wafer cleaning method of claim 1, wherein applying the cleaning chemical further includes applying at least a second sponge towards the far edge of the wafer within an enclosure for brush cleaning, and applying at least a third sponge towards the far edge of the wafer after CMP and brush cleaning and outside the enclosure for brush cleaning.

6. The wafer cleaning method of claim 1, wherein the sponge comprises a concentric tube with inner chemical flow-in.

7. A method of applying a chemical composition toward a far edge of a wafer, the method comprising:
    chemical mechanical polishing (CMP) of the wafer;
    applying deionized water to the wafer; and
    applying a cleaning chemical to the wafer, the cleaning chemical comprising a combination of at least two of $HNO_3$, $H_2SO_4$, $NH_4OH$, KOH and organic amine, wherein applying the cleaning chemical includes directing the cleaning chemical towards a far edge of the wafer and applying a sponge towards the far edge of the wafer after CMP and outside an enclosure used for CMP.

8. The wafer cleaning method of claim 7, wherein applying the sponge is performed within an enclosure for brush cleaning.

9. The wafer cleaning method of claim 7 further comprising: applying at least a second sponge towards the far edge of the wafer within an enclosure for brush cleaning.

10. The wafer cleaning method of claim 7 further comprising: applying at least a second sponge towards the far edge of the wafer within an enclosure for brush cleaning, and applying at least a third sponge towards the far edge of the wafer after CMP and brush cleaning and outside the enclosure for brush cleaning.

11. The wafer cleaning method of claim 7, wherein the sponge comprises a concentric tube with inner chemical flow-in.

12. A method of applying a chemical composition toward a far edge of a wafer, the method comprising:
    chemical mechanical polishing (CMP) of the wafer;
    applying deionized water to the wafer, and
    applying a cleaning chemical to the wafer, the cleaning chemical comprising at least one pH adjuster among $HNO_3$, $H_2SO_4$, $NH_4OH$, KOH or organic amine, wherein applying the cleaning chemical includes directing the cleaning chemical towards a far edge of the wafer and applying a sponge towards the far edge of the wafer after CMP, outside an enclosure used for CMP, and within an enclosure for brush cleaning.

13. The wafer cleaning method of claim 12, wherein applying the cleaning chemical includes directing the cleaning chemical towards a far edge of the wafer and applying a first sponge towards the far edge of the wafer after CMP, outside an enclosure used for CMP, and applying at least a second sponge towards the far edge of the wafer within an enclosure for brush cleaning.

14. The wafer cleaning method of claim 12, wherein applying the cleaning chemical includes directing the cleaning chemical towards a far edge of the wafer and applying a first sponge towards the far edge of the wafer after CMP, outside an enclosure used for CMP, applying at least a second sponge towards the far edge of the wafer within an enclosure for brush cleaning, and applying at least a third sponge towards the far edge of the wafer after CMP and brush cleaning and outside the enclosure for brush cleaning.

15. The wafer cleaning method of claim 12, wherein the cleaning chemical is applied by a cleaning dispensing unit arranged to direct cleaning fluids toward a far edge of the wafer after the CMP of the wafer, wherein the cleaning dispensing unit comprises a sponge having a concentric tube with inner chemical flow-in.

\* \* \* \* \*